(12) United States Patent
Hung et al.

(10) Patent No.: US 12,207,409 B2
(45) Date of Patent: Jan. 21, 2025

(54) MODULAR CAPACITOR SUBASSEMBLY FOR BACKUP POWER

(71) Applicant: Intel Corporation, Santa Clara, CA (US)

(72) Inventors: John Hung, Vancouver (CA); Andrew Morning-Smith, Vancouver (CA); Kai-Uwe Schmidt, Vancouver (CA); Nan Allison Yao, Regina (CA)

(73) Assignee: Intel Corporation, Santa Clara, CA (US)

( * ) Notice: Subject to any disclaimer, the term of this patent is extended or adjusted under 35 U.S.C. 154(b) by 860 days.

(21) Appl. No.: 17/081,502

(22) Filed: Oct. 27, 2020

(65) Prior Publication Data

US 2021/0045247 A1 Feb. 11, 2021

(51) Int. Cl.
*H05K 1/18* (2006.01)
*H05K 1/14* (2006.01)
*G06F 1/18* (2006.01)

(52) U.S. Cl.
CPC ............ *H05K 1/181* (2013.01); *H05K 1/142* (2013.01); *G06F 1/187* (2013.01); *H05K 2201/10015* (2013.01); *H05K 2201/10628* (2013.01); *H05K 2201/10651* (2013.01)

(58) Field of Classification Search
CPC ............... H05K 1/181; H05K 1/142; H05K 2201/10015; H05K 2201/10628; H05K 2201/09063; H05K 2201/10189; H05K 2201/10651; H05K 3/3447; H05K 1/141; H05K 1/144; G06F 1/187; G11C 5/141; G11C 16/30
See application file for complete search history.

(56) References Cited

U.S. PATENT DOCUMENTS

| | | | |
|---|---|---|---|
| 5,576,935 A * | 11/1996 | Freer | H05K 7/1461 361/796 |
| 10,199,977 B1 * | 2/2019 | Mohammadpour | H05K 7/14329 |
| 2011/0153903 A1 | 6/2011 | Hinkle et al. | |
| 2015/0062833 A1 * | 3/2015 | Ismayilov | H05K 7/14325 361/730 |
| 2016/0104574 A1 * | 4/2016 | Whitmire | H05K 3/3447 174/126.1 |
| 2018/0270943 A1 * | 9/2018 | Suzuki | G06F 1/187 |
| 2019/0254166 A1 | 8/2019 | Ji et al. | |
| 2021/0345489 A1 * | 11/2021 | Ryu | H01G 9/06 |
| 2021/0367360 A1 * | 11/2021 | Chen | H01R 12/73 |
| 2022/0087072 A1 * | 3/2022 | Matsuda | H05K 7/20509 |

OTHER PUBLICATIONS

Extended European Search Report from European Patent Application No. 21197724.4 notified Apr. 4, 2022, 8 pgs.

* cited by examiner

*Primary Examiner* — Steven T Sawyer
(74) *Attorney, Agent, or Firm* — Essential Patents Group, LLP

(57) ABSTRACT

An embodiment of an electronic system comprises a main board, and a modular capacitor subassembly mechanically and electrically coupled to the main board, wherein the modular capacitor subassembly provides backup power for the main board, and wherein the main board is adapted for use in at least two housing form factors. Other embodiments are disclosed and claimed.

17 Claims, 9 Drawing Sheets

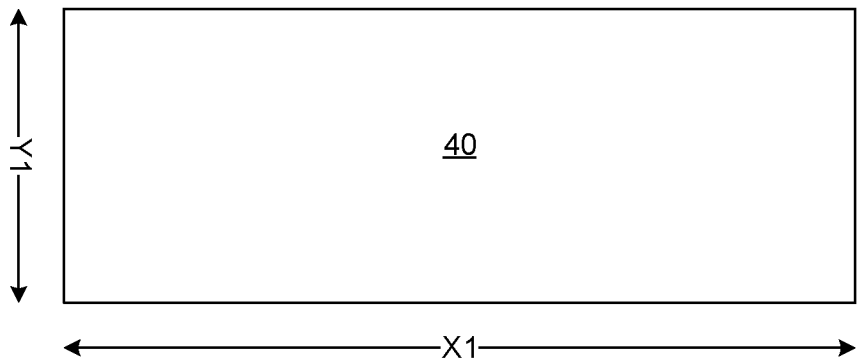
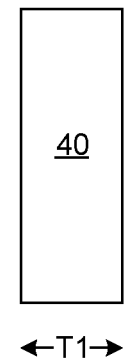
FIG. 4A  FIG. 4B
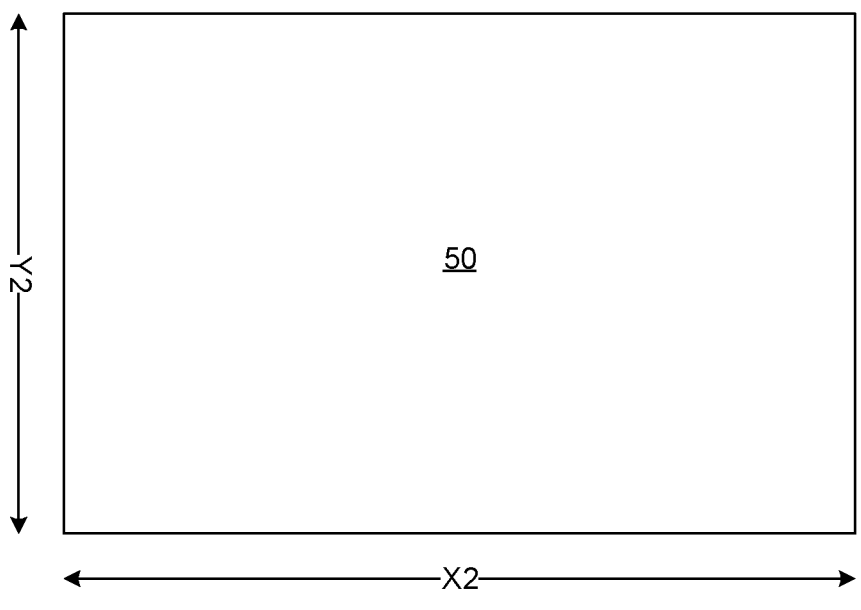
FIG. 5A  FIG. 5B

MODULAR CAPACITOR SUBASSEMBLY FOR BACKUP POWER

BACKGROUND

An electronic device may store information in volatile memory. In the case of power loss, the device may require or benefit from retention of the information stored in the volatile memory. Some devices may utilize capacitors to provide enough power to copy the information to nonvolatile memory. For example, a solid-state drive (SSD) device may include POWER LOSS IMMINENT (PLI) technology with energy storing capacitors. The energy storing capacitors provide enough energy (power) to complete any commands in progress and to make sure that any data in the temporary buffers is committed to the non-volatile NAND Flash media. These capacitors act as backup batteries for the drive. An SSD supply voltage detector circuit constantly monitors the drive's supply voltage. If voltage falls below a predefined level, indicating a power loss event is imminent, the SSD will use the backup energy in the capacitors to write any data in temporary buffers to the NAND Flash media. After power is restored, the PLI capacitors will be charged again, ready for a future power loss event.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures:

FIGS. 4A and 4B are top and side views, respectively, of an example of a housing according to an embodiment;

FIGS. 5A and 5B are top and side views, respectively, of another example of a housing according to an embodiment;

DETAILED DESCRIPTION

Figure 1:
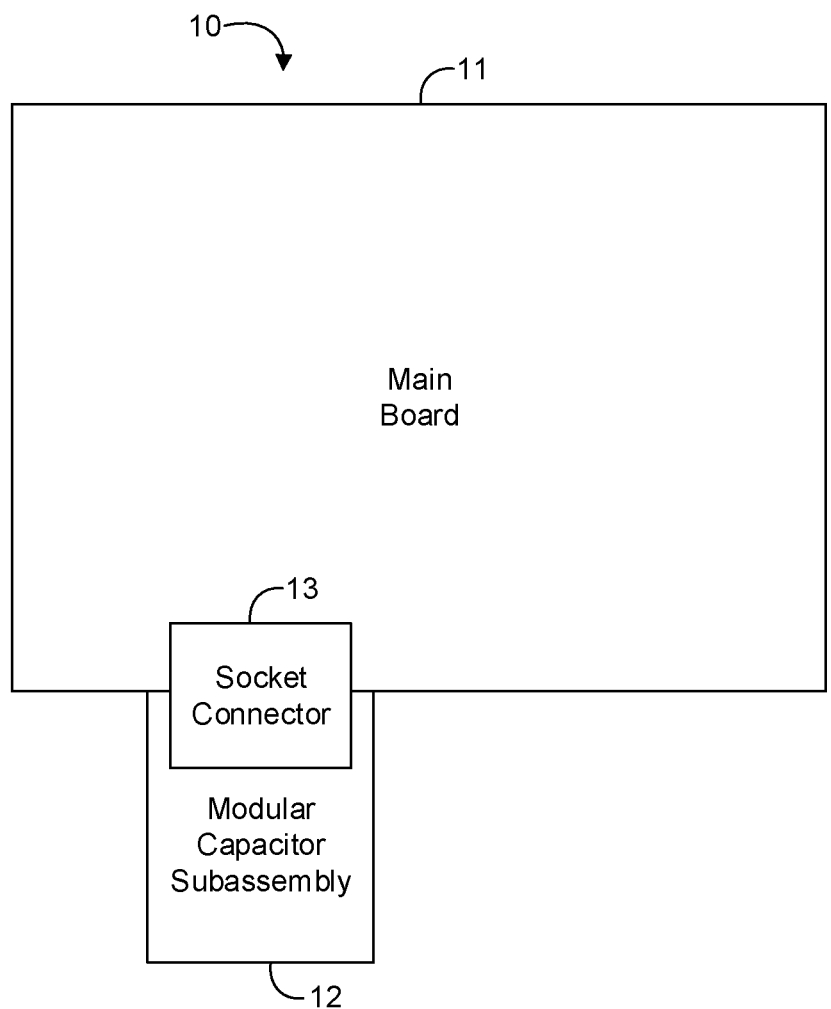
FIG. 1 is a block diagram of an example of an electronic system according to an embodiment.

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

While the following description sets forth various implementations that may be manifested in architectures such as system-on-a-chip (SoC) architectures for example, implementation of the techniques and/or arrangements described herein are not restricted to particular architectures and/or computing systems and may be implemented by any architecture and/or computing system for similar purposes. For instance, various architectures employing, for example, multiple integrated circuit (IC) chips and/or packages, and/or various computing devices and/or consumer electronic (CE) devices such as set top boxes, smartphones, etc., may implement the techniques and/or arrangements described herein. Further, while the following description may set forth numerous specific details such as logic implementations, types and interrelationships of system components, logic partitioning/integration choices, etc., claimed subject matter may be practiced without such specific details. In other instances, some material such as, for example, control structures and full software instruction sequences, may not be shown in detail in order not to obscure the material disclosed herein.

References in the specification to "one implementation", "an implementation", "an example implementation", etc., indicate that the implementation described may include a particular feature, structure, or characteristic, but every embodiment may not necessarily include the particular feature, structure, or characteristic. Moreover, such phrases are not necessarily referring to the same implementation. Further, when a particular feature, structure, or characteristic is described in connection with an embodiment, it is submitted that it is within the knowledge of one skilled in the art to effect such feature, structure, or characteristic in connection with other implementations whether or not explicitly described herein.

Various embodiments described herein may include a memory component and/or an interface to a memory component. Such memory components may include volatile and/or nonvolatile (NV) memory. Volatile memory may be a storage medium that requires power to maintain the state of data stored by the medium. Non-limiting examples of volatile memory may include various types of random access memory (RAM), such as dynamic RAM (DRAM) or static RAM (SRAM). One particular type of DRAM that may be used in a memory module is synchronous dynamic RAM (SDRAM). In particular embodiments, DRAM of a memory component may comply with a standard promulgated by Joint Electron Device Engineering Council (JEDEC), such as JESD79F for double data rate (DDR) SDRAM, JESD79-2F for DDR2 SDRAM, JESD79-3F for DDR3 SDRAM, JESD79-4A for DDR4 SDRAM, JESD209 for Low Power DDR (LPDDR), JESD209-2 for LPDDR2, JESD209-3 for LPDDR3, JESD209-4 for LPDDR4, and JESD79-5 for DDR5 (these standards are available at jedec.org). Such standards (and similar standards) may be referred to as DDR-based standards and communication interfaces of the storage devices that implement such standards may be referred to as DDR-based interfaces.

NV memory (NVM) may be a storage medium that does not require power to maintain the state of data stored by the medium. In one embodiment, the memory device may include a block addressable memory device, such as those based on NAND or NOR technologies. A memory device may also include future generation nonvolatile devices, such as a three dimensional (3D) crosspoint memory device, or other byte addressable write-in-place nonvolatile memory devices. In one embodiment, the memory device may be or may include memory devices that use chalcogenide glass, multi-threshold level NAND flash memory, NOR flash memory, single or multi-level Phase Change Memory (PCM), a resistive memory, nanowire memory, ferroelectric transistor RAM (FeTRAM), anti-ferroelectric memory, magnetoresistive RAM (MRAM) memory that incorporates memristor technology, resistive memory including the metal oxide base, the oxygen vacancy base and the conductive bridge RAM (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory. The memory device may refer to the die itself and/or to a packaged memory product. In particular embodiments, a memory component with non-volatile memory may comply with one or more standards promulgated by the JEDEC, such as JESD218, JESD219, JESD220-1, JESD223B, JESD223-1, JESD230, or other suitable standard (the JEDEC standards cited herein are available at jedec.org).

A variety of electronic devices may require or benefit from a backup power source to provide power in the event of main power loss. For example, a processor may utilize backup power to save state information or other data if main power is lost. In another example, a storage device may utilize backup power to commit data stored in volatile memory to nonvolatile memory if main power is lost. Some devices may utilize capacitors as energy storing devices to provide such backup power. Conventionally, such capacitors are hard wired to a main board (e.g., a processor motherboard, a memory card main board, a solid state drive (SSD) main board, etc.) and are selected to meet the backup power requirements of that particular main board and/or application. The conventional main boards are specifically designed for a particular form factor. For small form factors, tantalum capacitors may provide higher energy storage per volume as compared to aluminum electrolytic (AlE) capacitors, but at a higher overall cost. Problems with utilizing different main boards for different form factors include more time put into board design and validation, higher inventory cost, and less board space for wiring and other components when using multiple through hole AlE capacitors. Some embodiments may utilize a modular capacitor subassembly for backup power to advantageously overcome one or more of the foregoing problems.

With reference to FIG. 1, an embodiment of an electronic system 10 may comprise a main board 11, and a modular capacitor subassembly 12 mechanically and electrically coupled to the main board 11. For example, the modular capacitor subassembly 12 provides backup power for the main board 11, and the main board 11 is adapted for use in at least two housing form factors. In some embodiments, the system 10 further comprises a socket connector 13 mechanically and electrically coupled to the main board 11, where the modular capacitor subassembly 12 is plugged into the socket connector 13. For example, the socket connector 13 may comprise a through board socket and the modular capacitor subassembly 12 may comprise two or more leads plugged into the through board socket perpendicular to the main board 11.

Alternatively, in some embodiments the socket connector 13 may comprise a surface mount socket and the modular capacitor subassembly 12 may comprise two or more leads plugged into the surface mount socket parallel to the main board 11. In some embodiments, the modular capacitor subassembly 12 may comprise one or more leaded capacitors, and a thickness of the one or more leaded capacitors may be in accordance with a thickness of one of the at least two housing form factors. For example, the main board may comprise a processor motherboard, a SSD main board, etc.

Figure 2:
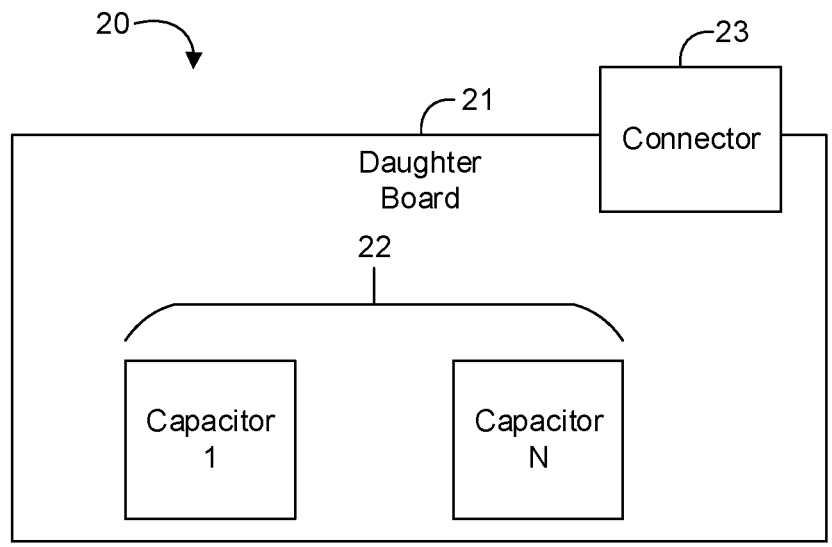
FIG. 2 is a block diagram of an example of a modular capacitor apparatus according to an embodiment.

With reference to FIG. 2, an embodiment of a modular capacitor apparatus 20 may comprise a daughter board 21, one or more capacitors 22 mechanically and electrically coupled to the daughter board 21, the one or more capacitors 22 to provide backup power to a main board, and a connector 23 coupled to the daughter board 21, where the connector 23 is to be mechanically and electrically coupled to the main board to provide the backup power to the main board. In some embodiments, the connector 23 includes two or more leads arranged to couple perpendicular to the main board. Alternatively, in some embodiments the connector 23 includes two or more leads arranged to couple parallel to the main board. For example, the one or more capacitors 22 comprise one or more leaded capacitors, and a thickness of the one or more leaded capacitors is in accordance with a thickness of a housing form factor.

Figure 3:
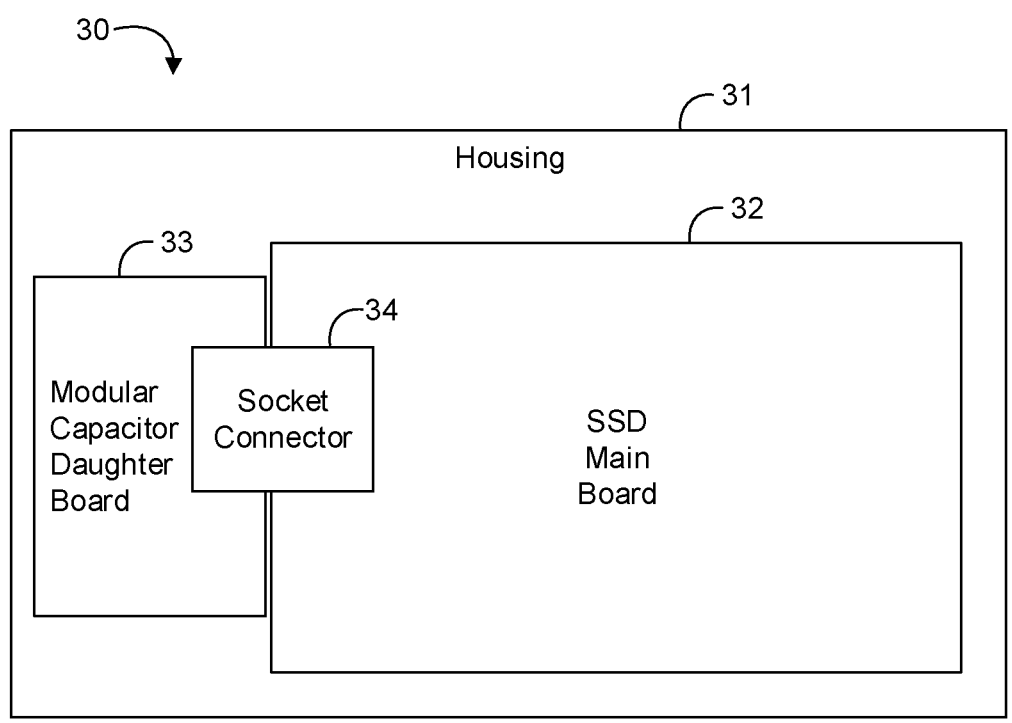
FIG. 3 is a block diagram of an example of a SSD apparatus according to an embodiment.
Figure 6A:
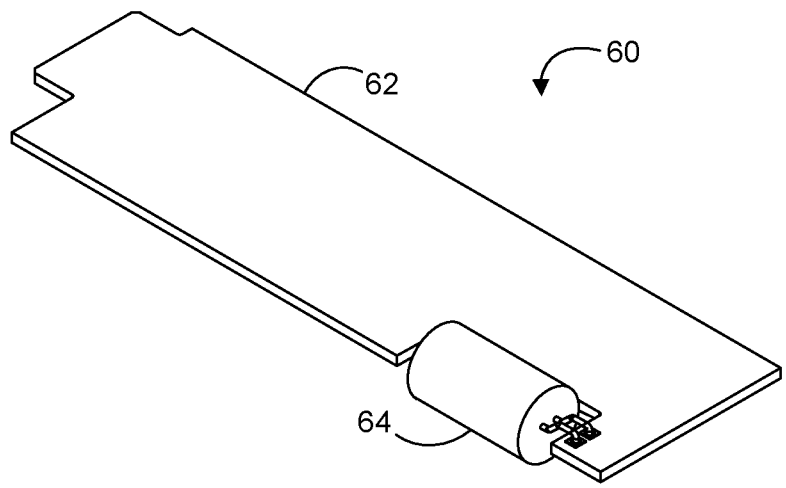
FIGS. 6A to 6D are perspective, top, side, and front views, respectively, of an example of a SSD assembly according to an embodiment.
Figure 6B:
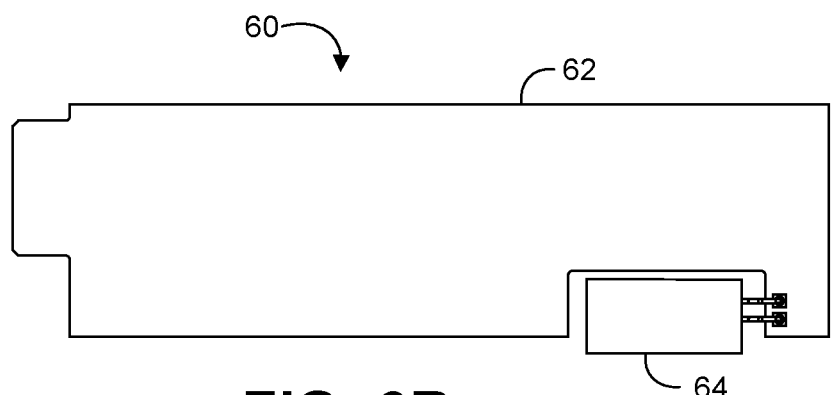
Figure 6C:
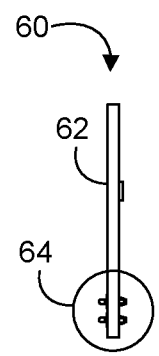
Figure 6D:
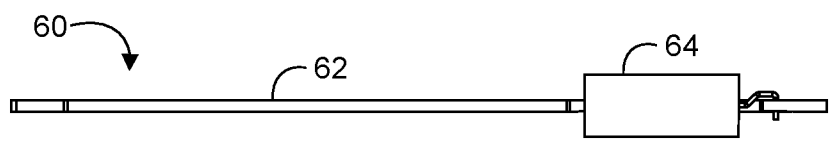
Figure 7A:
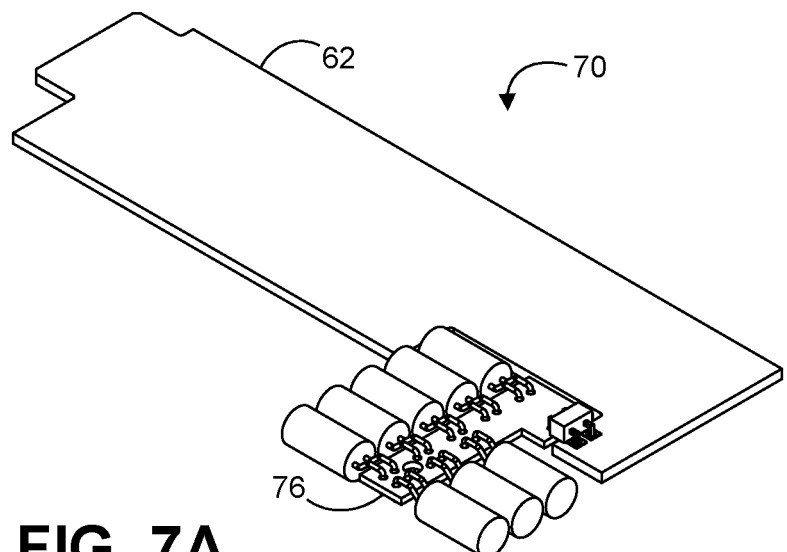
FIGS. 7A to 7D are perspective, top, side, and front views, respectively, of another example of a SSD assembly according to an embodiment.
Figure 7B:
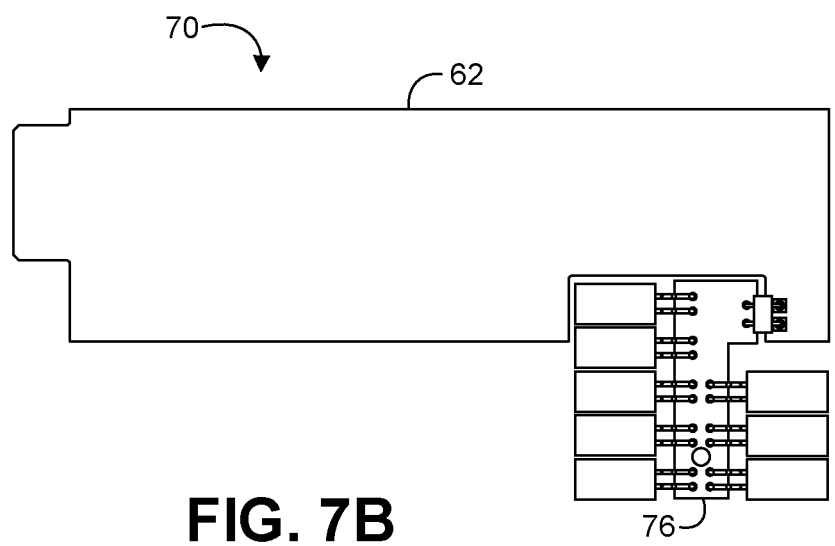
Figure 7C:
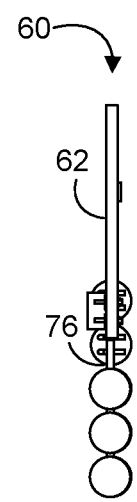
Figure 7D:
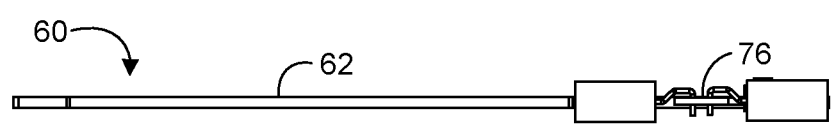

With reference to FIG. 3, an embodiment of a SSD apparatus 30 may comprise a housing 31 having a first form factor, a SSD main board 32 disposed within the housing 31, and a modular capacitor daughter board 33 disposed within the housing 31 and mechanically and electrically coupled to the SSD main board 32. Those skilled in the art will appreciate that any suitable technology may be utilized to couple the modular capacitor daughter board 33 to the SSD main board 32. For example, wire leads may be soldered to one or both of the boards 32, 33, any suitable connector technology may be utilized (e.g., pin/header type connectors, zero insertion force (ZIF) connectors, etc.), etc.

In some embodiments, the modular capacitor daughter board 33 may provide backup power for the SSD main board 32, and the SSD main board 32 may be adapted for use in a second housing having a second form factor. In some embodiments, the SSD apparatus 30 further comprises a socket connector 34 mechanically and electrically coupled to the main board 32, where the modular capacitor daughter board 33 is plugged into the socket connector 34. For example, the socket connector 34 may comprise a through board socket, and the modular capacitor daughter board 33 may comprise two or more leads plugged into the through board socket perpendicular to the SSD main board 32. In an alternative example, the socket connector 34 may comprise a surface mount socket, and the modular capacitor daughter board 33 may comprise two or more leads plugged into the surface mount socket parallel to the SSD main board 32. In some embodiments, the modular capacitor daughter board 33 may comprise one or more leaded capacitors, and a thickness of the one or more leaded capacitors may be in accordance with a thickness of the first form factor.

In an SSD device, a printed circuit board that includes a controller component and nonvolatile storage components (e.g., NAND devices) may be referred to herein as a SSD main board. Some embodiments may advantageously provide a modular capacitor daughter board that allows the same SSD main board to be utilized in multiple SSD devices with different form factors. For example, the Enterprise & Datacenter SSD Form Factor (EDSFF) standard (edsffspec, org) defines several form factors with a common connector but differences in thickness and X-Y dimensions. Some embodiments may utilize the same SSD main board for multiple SSD devices with different form factors, advantageously reducing engineering work and streamlining inventory management (e.g., embodiments of the SSD main board are fungible between multiple SSD devices with different form factors). For example, to support low cost and sufficient energy for the a first SSD device, some embodiments may utilize an 8 mm diameter PLI capacitor on the SSD main board. A second SSD device, however, may have a thinner form factor of, for example, 7.5 mm thickness. If the SSD main board with the 8 mm diameter PLI capacitor was to be reused in the second SSD device, the capacitor would not fit due to the thinner form factor of the second SSD device. Some embodiments may advantageously solve this problem in a way that is cost-effective and improved or optimized for inventory efficiency.

To utilize the same SSD main board in multiple SSD device with different form factors, some embodiments may reuse the holes that are normally used to install an 8 mm diameter AlE capacitor and use the holes to support a modular capacitor daughter board with thinner capacitors to fit into the second SSD device with the thinner form factor. For example, the second SSD device may have a form factor that provides more space in its enclosure with a large x-y dimension of the form factor which can hold more capacitors, if needed, for flexible PLI energy capacity. By utilizing the same SSD main board in multiple SSD devices with different form factors, some embodiments advantageously streamline engineering and factory operations to provide cost effective SSD devices for a wider variety of applications.

Some embodiments may provide a modular capacitor daughter board that can attach onto a SSD main board. This modular approach advantageously allows flexibility in size and capacitance of the PLI capacitors and may provide for utilizing the same SSD main board in multiple SSD devices with different form factors (e.g., and/or different PLI requirements). In some embodiments, a plug and socket mechanism may be utilized to allow easy installation of either a regular capacitor or the daughter board as needed for the different form factors. In some embodiments, the modular technology described herein may utilize the high market volume of SSD main boards for one type of SSD device to reduce the cost for another type of SSD device that has lower market volume. Some embodiments may also reduce the amount of inventory needed to keep in a factory while supporting multiple form factors. Some embodiments may also reduce the work needed as compared to supporting multiple different board layouts for the different form factors. Furthermore, with the use of a through-board socket, some embodiments may advantageously simplify the assembly and testing because there is no longer a need for manual soldering or separate testing of the different SSD devices.

With reference to FIGS. 4A to 4B, an embodiment of a housing 40 for a SSD device may have an X-Y dimension of X1, Y1 and a thickness of T1. For example, the dimensions of the housing 40 may nominally conform to a form factor as defined in the Enterprise and Datacenter 1U Short SSD Form Factor (hereinafter referred to as form factor "E1.S", see SFF-TA-1006 Specification, Rev 1.4 Mar. 27, 2020, edsffspec.org).

With reference to FIGS. 5A to 5B, an embodiment of a housing 50 for a SSD device may have an X-Y dimension of X2, Y2 and a thickness of T2. For example, the dimensions of the housing 50 may nominally conform to a form factor as defined in the Enterprise and Datacenter SSD 3" Form Factor (hereinafter referred to as form factor "E3", see SFF-TA-1008 Specification, Revision 1.0 Mar. 30, 2018, edsffspec.org). In this example, the X dimensions of the E1.S and E3 form factors may be substantially the same while the Y and thickness dimensions are different.

With reference to FIGS. 6A to 6D, an embodiment of a SSD assembly 60 may include a SSD main board 62 with a PLI capacitor 64 mechanically and electrically coupled to the SSD main board 62 via two capacitor leads connected to respective through board sockets on the SSD main board 62 (e.g., where the leads of the PLI capacitor 64 are arranged perpendicular to the SSD main board 62). Alternatively, the SSD main board 62 may provide two through holes and the two capacitor leads may be soldered to the respective through holes on the SSD main board 62. In the SSD assembly 60, an 8 mm diameter AlE capacitor may provide sufficient backup energy for the PLI application.

Figure 8A:
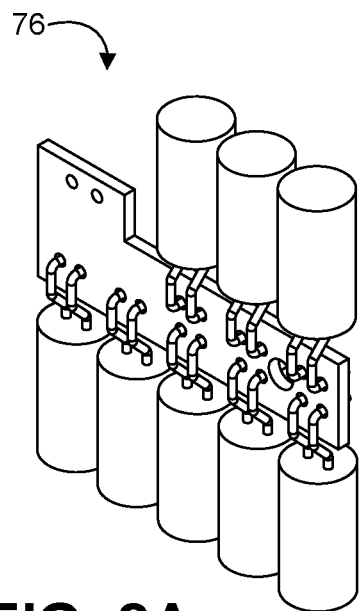
FIGS. 8A to 8B are perspective and top views, respectively, of an example of a modular capacitor daughter board according to an embodiment.
Figure 8B:
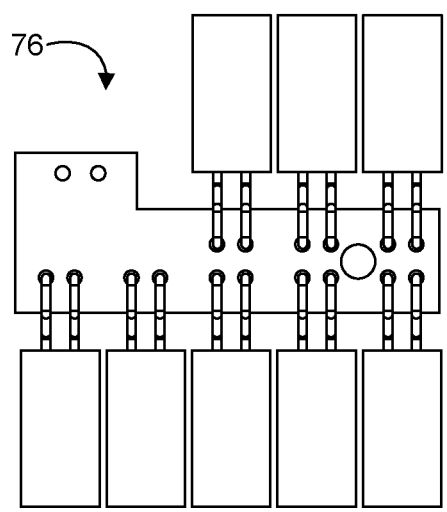

With reference to FIGS. 7A to 7D, an embodiment of a SSD assembly 70 may include the SSD main board 62 with a modular capacitor daughter board 76 mechanically and electrically coupled to the SSD main board 62 via two connector leads connected to respective through board sockets on the SSD main board 62 (e.g., where the leads of the modular capacitor daughter board 76 are arranged parallel to the SSD main board 62. In the SSD assembly 70, the modular capacitor daughter board 76 may utilize multiple 5 mm diameter AlE capacitors to provide sufficient backup energy for the PLI application. FIGS. 8A to 8B show enlarged views of the modular capacitor daughter board 76, without its connector. Any suitable connector may be utilized to connect the modular capacitor daughter board 76 to the SSD main board 62.

Alternatively, the SSD main board 62 may provide two through holes and two wired leads from the modular capacitor daughter board 76 may be soldered to the respective through holes on the SSD main board 62.

Figure 9:
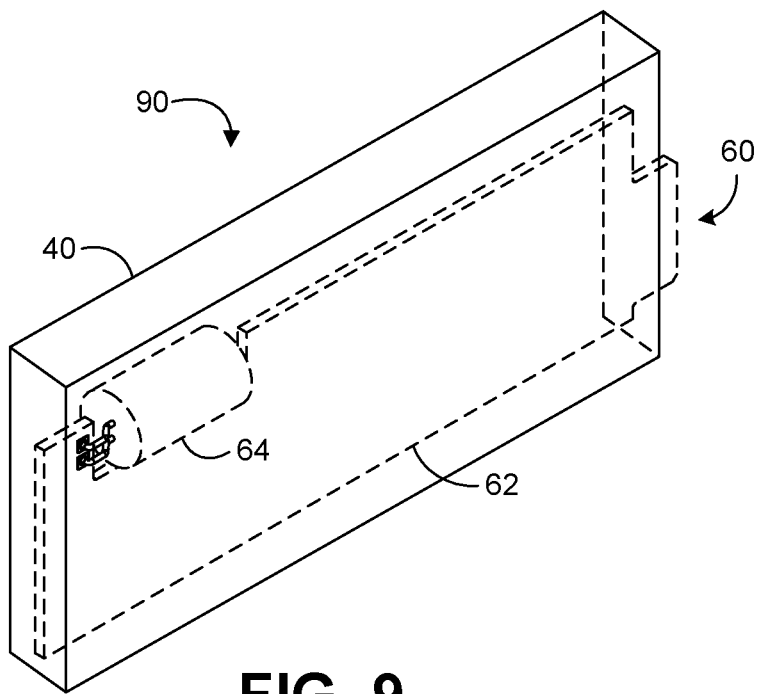
FIG. 9 is a perspective view of an example of a SSD device according to an embodiment.
Figure 10:
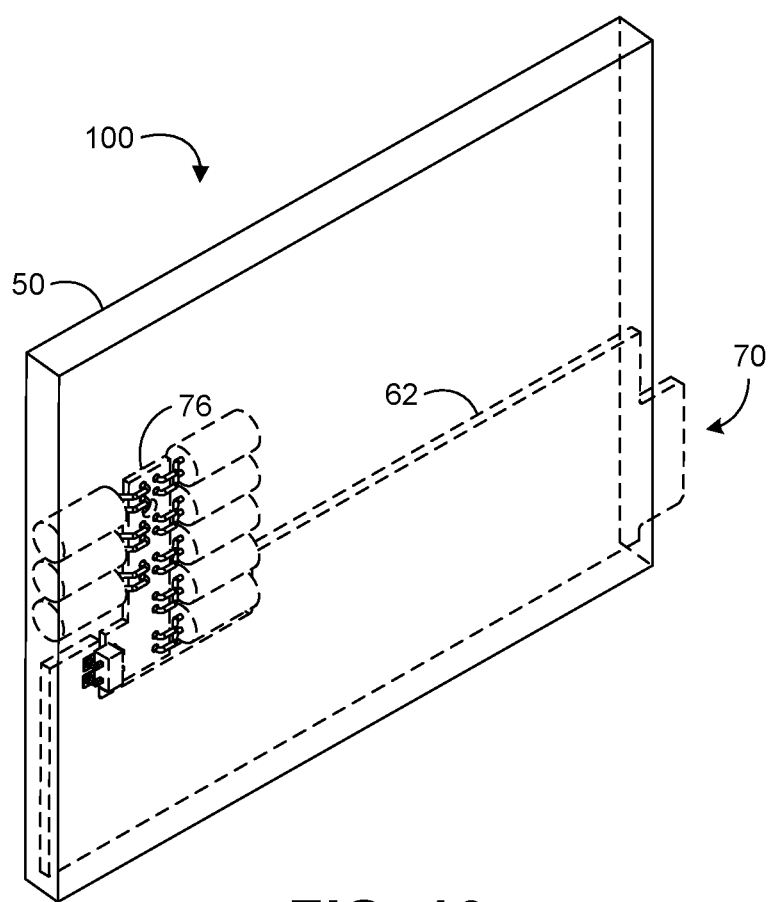
FIG. 10 is a perspective view of another example of a SSD device according to an embodiment.

With reference to FIG. 9, an embodiment of a SSD device 90 may include the housing 40 and the SSD assembly 60. For example, the SSD device 90 may be suitable for applications with the E1.S form factor. With reference to FIG. 10, an embodiment of a SSD device 100 may include the housing 50 and the SSD assembly 70. For example, the SSD device 90 may be suitable for applications with the E1.S form factor. Advantageously, both the SSD assembly 60 and the SSD assembly 70 utilize the same SSD main board 62.

Advantageously, some embodiments simplify the inventory process and reduce costs because there is no longer a need to keep a separate inventory for each form factor. Both E1.S and E3 form factors use the same SSD main board, which also simplifies the work needed to be done on the board architecture. Embodiments of a modular approach also advantageously increase ease of testing. The electrical validation for both form factors will be the same and the modularity of the PLI capacitor sockets provides the capability to switch out capacitors at test time.

Figure 11:
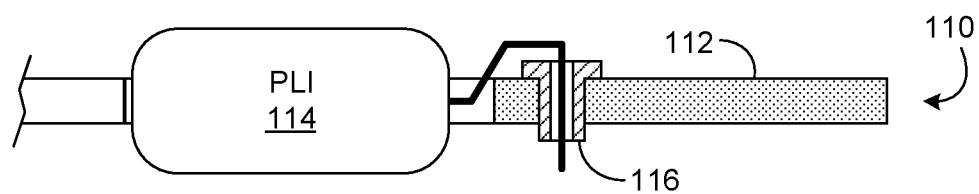
FIG. 11 is a block diagram and partial cross-section view of an example of an assembly according to an embodiment.

With reference to FIG. 11, an embodiment of an assembly 110 includes a main board 112 and a PLI subassembly 114. Some embodiments of the assembly 110 provide a robust implementation with an off the shelf through-board socket 116 which uses surface mount technology (SMT). The socket 116 uses a spring-loaded mechanism and can accept the leads from the PLI subassembly 114 (e.g., the leads of the 8 mm PLI capacitor, the standard connector leads of the daughter board 76, etc.). With this SMT socket 116, the main board can be reflowed normally and the differentiation between the E1.S and E3 form factors can happen later.

Figure 12A:
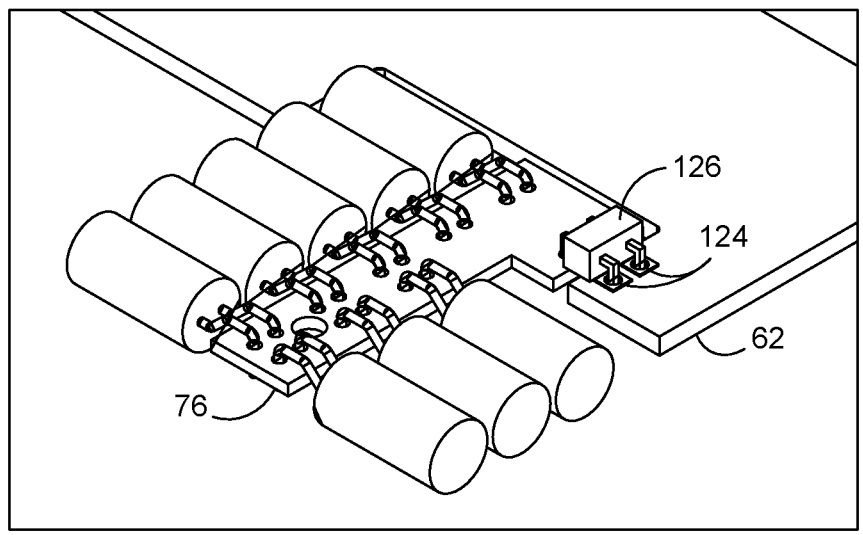
FIG. 12A is an enlarged and fragmented perspective view of the SSD assembly from FIGS. 7A to 7D.
Figure 12B:
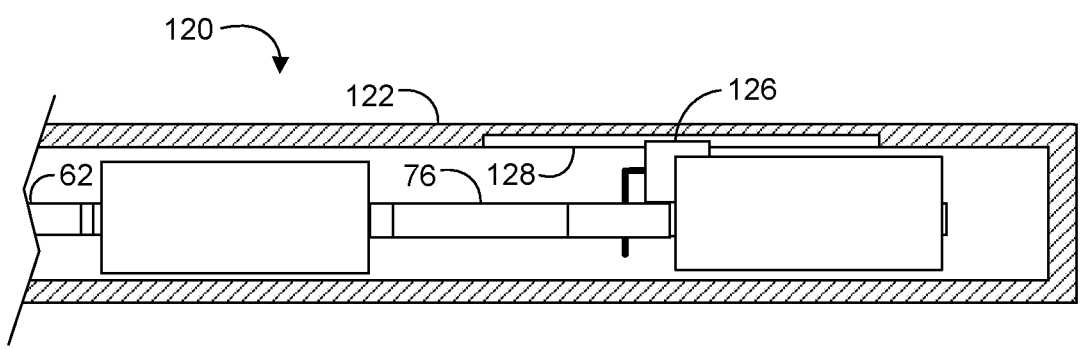
FIG. 12B is a fragmented, partial cross section front view of an example of a SSD device according to an embodiment.

With reference to FIGS. 12A to 12B, an embodiment of a SSD device 120 may include an enclosure 122 with the SSD main board 62 and modular capacitor daughter board 76 disposed inside the enclosure 122. The enclosure 122 may have an E3 form factor with relatively limited space. Accordingly, the fit of the components and connectors is important. As noted above, a through board SMT socket 124 provides a robust implementation but the mating connector 126 has a higher profile. By using 5 mm diameter capacitors and machining out a notch/pocket 128 on the enclosure 122 for the connector 126, embodiments of the SSD device 120 may advantageously employ the SSD main board 62 with the modular capacitor daughter board 76.

Figure 13:
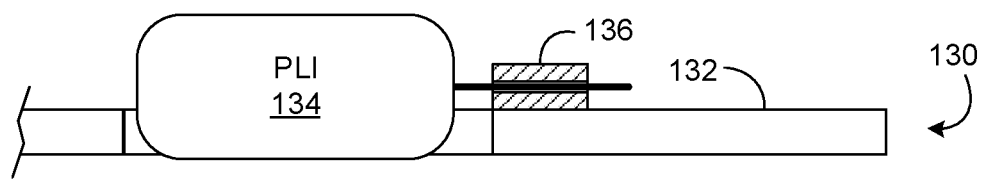
FIG. 13 is a block diagram and partial cross-section view of another example of an assembly according to an embodiment.

With reference to FIG. 13, an embodiment of an assembly 130 includes a main board 132 and a PLI subassembly 134. Some embodiments of the assembly 130 utilize an off the shelf parallel socket 136 which uses SMT. The socket 136 uses a spring-loaded mechanism and can accept the leads from the PLI subassembly 134 (e.g., the leads of the 8 mm PLI capacitor, right-angle header leads of the daughter board 76, etc.). With this SMT socket 136, the main board can be reflowed normally and the differentiation between the E1.S and E3 form factors can happen later.

Figure 14A:
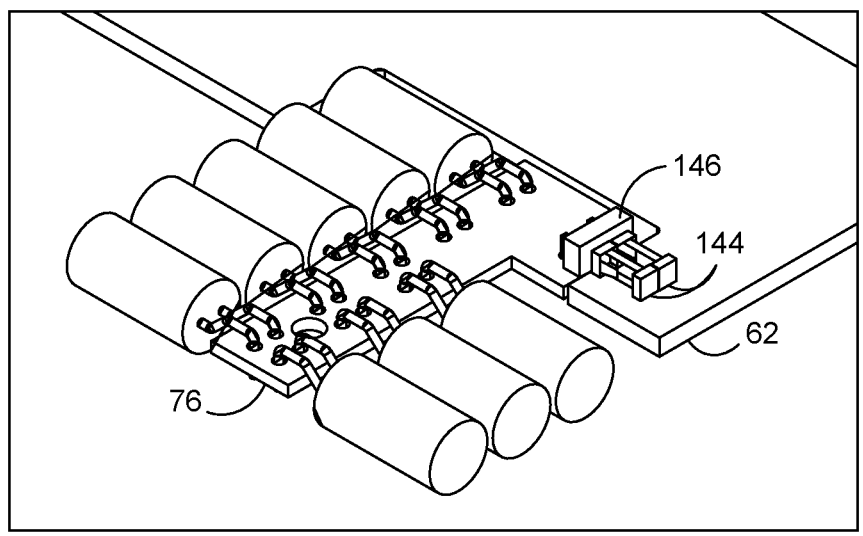
FIG. 14A is an enlarged and fragmented perspective view of another example of an SSD assembly according to an embodiment.
Figure 14B:
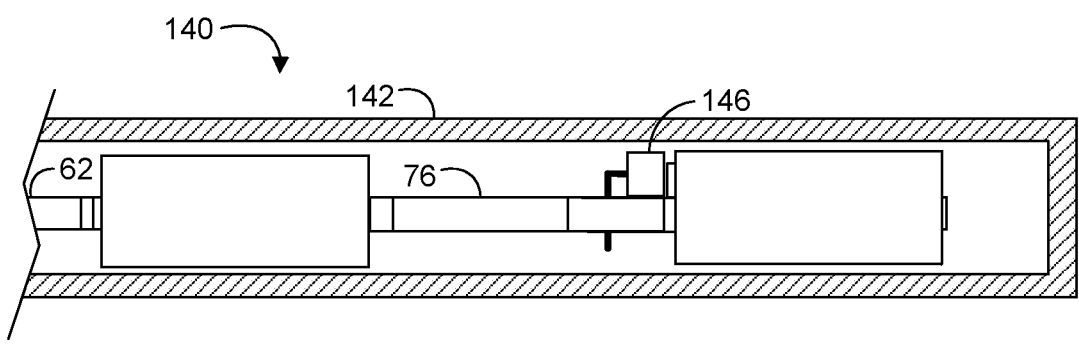
FIG. 14B is a fragmented, partial cross section front view of another example of a SSD device according to an embodiment.

With reference to FIGS. 14A to 14B, an embodiment of a SSD device 140 may include an enclosure 142 with the SSD main board 62 and modular capacitor daughter board 76 disposed inside the enclosure 142. The enclosure 142 may have an E3 form factor. The SSD main board 62 may utilize a parallel SMT socket 144 and the daughter board 76 may utilize a right-angle header for its connector 146. The connector 146 has a lower profile as compared to the connector 126, and no machining may be needed to allow for spacing of the header.

The embodiments described herein illustrate only non-limiting examples of main boards, daughter boards, connectors, capacitors, PLI subassemblies, etc. Given the benefit of the present specification and drawings, numerous other examples will occur to those skilled in the art. In particular, other embodiments of a modular capacitor daughter board may be effectively utilized in other scenarios where a common printed circuit board (PCB) is being used for multiple form factors.

The technology discussed herein may be provided in various computing systems (e.g., including a non-mobile computing device such as a desktop, workstation, server, rack system, etc., a mobile computing device such as a smartphone, tablet, Ultra-Mobile Personal Computer (UMPC), laptop computer, ULTRABOOK computing device, smart watch, smart glasses, smart bracelet, etc., and/or a client/edge device such as an Internet-of-Things (IoT) device (e.g., a sensor, a camera, etc.)).

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrase "one or more of A, B, and C" and the phrase "one or more of A, B, or C" both may mean A; B; C; A and B; A and C; B and C; or A, B and C. Various components of the systems described herein may be implemented in software, firmware, and/or hardware and/or any combination thereof. For example, various components of the systems or devices discussed herein may be provided, at least in part, by hardware of a computing SoC such as may be found in a computing system such as, for example, a smart phone. Those skilled in the art may recognize that systems described herein may include additional components that have not been depicted in the corresponding figures. For example, the systems discussed herein may include additional components such as brackets, alignment pins and the like that have not been depicted in the interest of clarity.

While implementation of the example processes discussed herein may include the undertaking of all operations shown in the order illustrated, the present disclosure is not limited in this regard and, in various examples, implementation of the example processes herein may include only a subset of the operations shown, operations performed in a different order than illustrated, or additional operations.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the embodiments are not limited to the embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the embodiments should, therefore, be determined with reference to the appended claims, along with the full scope of equivalents to which such claims are entitled.

What is claimed is:

1. An electronic system, comprising:
    a main board which is adapted for use in any of at least two housing form factors which are each defined in an Enterprise & Datacenter Solid-State Drive Form Factor standard;
    a socket connector mechanically and electrically coupled to the main board; and
    a modular capacitor subassembly comprising:

a daughter board which is mechanically and electrically coupled to the main board via two connector leads which are plugged each into a respective one of two sockets of the socket connector, the daughter board comprising a first surface, wherein a first edge of the first surface is opposite a second edge of the first surface;

a first one or more capacitors arranged along the first edge, wherein for each capacitor of the first one or more capacitors, a respective two leads extend from a respective first end of the capacitor, and across the first edge, to couple the capacitor to the daughter board; and a second one or more capacitors arranged along the second edge, wherein for each capacitor of the second one or more capacitors, a respective two leads extend from a respective second end of the capacitor, and across the second edge, to couple the capacitor to the daughter board;

wherein:

the respective first ends of the first one or more capacitors face the respective second ends of the second one or more capacitors; and the first one or more capacitors and the second one or more capacitors are electrically coupled to provide backup power for the main board via the two sockets.

2. The electronic system of claim 1, wherein the socket connector comprises a through board socket.

3. The electronic system of claim 2, wherein the modular capacitor subassembly comprises two or more leads plugged into the through board socket perpendicular to the main board.

4. The electronic system of claim 1, wherein the socket connector comprises a surface mount socket.

5. The electronic system of claim 4, wherein the modular capacitor subassembly comprises two or more leads plugged into the surface mount socket parallel to the main board.

6. The electronic system of claim 1, wherein a thickness of the first one or more capacitors is in accordance with a thickness of one of the at least two housing form factors.

7. The electronic system of claim 1, wherein the main board comprises a processor motherboard.

8. The electronic system of claim 1, wherein the main board comprises a solid state drive main board.

9. A modular capacitor apparatus, comprising:

a daughter board comprising a first surface, wherein a first edge of the first surface is opposite a second edge of the first surface;

a first one or more capacitors arranged along the first edge, wherein for each capacitor of the first one or more capacitors, a respective two leads extend from a respective first end of the capacitor, and across the first edge, to mechanically and electrically couple the capacitor to the daughter board;

a second one or more capacitors arranged along the second edge, wherein for each capacitor of the second one or more capacitors, a respective two leads extend from a respective second end of the capacitor, and across the second edge, to couple the capacitor to the daughter board; and a connector electrically coupled to each of the first one or more capacitors and the second one or more capacitors via the daughter board, wherein the connector is to be mechanically and electrically coupled to a main board to enable the first one or more capacitors and the second one or more capacitors to provide backup power to the main board;

wherein the respective first ends of the first one or more capacitors face the respective second ends of the second one or more capacitors.

10. The modular capacitor apparatus of claim 9, wherein the connector includes two or more leads arranged to couple perpendicular to the main board.

11. The modular capacitor apparatus of claim 9, wherein the connector includes two or more leads arranged to couple parallel to the main board.

12. The modular capacitor apparatus of claim 9, wherein a thickness of the first one or more capacitors is in accordance with a thickness of a housing form factor.

13. A solid state drive apparatus, comprising:

a housing having a first form factor which is defined in an Enterprise & Datacenter SSD Form Factor (EDSFF) standard;

a main board disposed within the housing, wherein the main board is adapted for use in either of the first form factor or a second form factor which is defined in the EDSFF standard; and a modular capacitor subassembly comprising:

a daughter board disposed within the housing and mechanically and electrically coupled to the main board, the daughter board comprising a first surface, wherein a first edge of the first surface is opposite a second edge of the first surface;

a first one or more capacitors arranged along the first edge, wherein for each capacitor of the first one or more capacitors, a respective two leads extend from a respective first end of the capacitor, and across the first edge, to couple the capacitor to the daughter board; and a second one or more capacitors arranged along the second edge, wherein for each capacitor of the second one or more capacitors, a respective two leads extend from a respective second end of the capacitor, and across the second edge, to couple the capacitor to the daughter board;

wherein:

the respective first ends of the first one or more capacitors face the respective second ends of the second one or more capacitors; and the first one or more capacitors and the second one or more capacitors are electrically coupled to provide backup power for the main board.

14. The solid state drive apparatus of claim 13, further comprising:

a socket connector mechanically and electrically coupled to the main board, wherein the modular capacitor subassembly is plugged into the socket connector.

15. The solid state drive apparatus of claim 14, wherein the socket connector comprises a through board socket, and wherein the modular capacitor subassembly comprises two or more leads plugged into the through board socket perpendicular to the main board.

16. The solid state drive apparatus of claim 14, wherein the socket connector comprises a surface mount socket, and wherein the modular capacitor subassembly comprises two or more leads plugged into the surface mount socket parallel to the main board.

17. The solid state drive apparatus of claim 13, wherein a thickness of the first one or more capacitors is in accordance with a thickness of the first form factor.

* * * * *